United States Patent
Yang et al.

(10) Patent No.: US 10,475,492 B1
(45) Date of Patent: Nov. 12, 2019

(54) CIRCUIT AND METHOD FOR READ LATENCY CONTROL

(71) Applicant: MACRONIX INTERNATIONAL CO., LTD., Hsinchu (TW)

(72) Inventors: Shang-Chi Yang, Xihu Township (TW); Chun-Yu Liao, Taichung (TW); Yi-Wei Chang, Qionglin Township (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 16/047,550

(22) Filed: Jul. 27, 2018

(51) Int. Cl.
*G11C 7/22* (2006.01)
*G11C 7/10* (2006.01)
*G11C 7/06* (2006.01)

(52) U.S. Cl.
CPC ............ *G11C 7/222* (2013.01); *G11C 7/06* (2013.01); *G11C 7/106* (2013.01); *G11C 7/1051* (2013.01)

(58) Field of Classification Search
CPC .................................................. G11C 7/1051
USPC .................................................. 365/189.15
See application file for complete search history.

(56) References Cited

U.S. PATENT DOCUMENTS

| | | | |
|---|---|---|---|
| 6,459,617 B1 | 10/2002 | Roohparvar | |
| 6,757,212 B2 * | 6/2004 | Hamamoto | G11C 7/1051 365/189.05 |
| 6,775,727 B2 | 8/2004 | Moyer | |
| 7,065,002 B2 * | 6/2006 | Kambara | G11C 7/22 365/189.05 |
| 8,503,256 B2 * | 8/2013 | Ko | G11C 7/1078 327/156 |
| 2002/0133646 A1 | 9/2002 | Cheung et al. | |
| 2005/0071570 A1 | 3/2005 | Takasugl et al. | |
| 2008/0133779 A1 | 6/2008 | Ho et al. | |
| 2009/0103362 A1 | 4/2009 | Pekny et al. | |
| 2009/0137318 A1 | 5/2009 | Russo et al. | |
| 2011/0072201 A1 | 3/2011 | Lee et al. | |
| 2011/0153910 A1 | 6/2011 | MacKenna et al. | |
| 2012/0324147 A1 | 12/2012 | Lai | |
| 2013/0056260 A1 | 3/2013 | Heisler, II et al. | |

(Continued)

FOREIGN PATENT DOCUMENTS

| | | |
|---|---|---|
| EP | 2966573 A1 | 1/2016 |
| TW | 1221968 | 10/2004 |

(Continued)

OTHER PUBLICATIONS

Adesto technologies, 4-megabit 2.3-volt or 2.7-volt Minimum SPI Serial Flash Memory, AT25DF041A, 3668F-DFLASH—Nov. 2013, Data Sheet, Nov. 2013, 42 pages.

(Continued)

*Primary Examiner* — Son L Mai
(74) *Attorney, Agent, or Firm* — Haynes Beffel & Wolfeld LLP

(57) ABSTRACT

A memory device comprises an array of memory cells, and a plurality of sense amplifiers coupled with the memory cells. A controller is configured to execute a read operation in response to a command and address, including a read cycle in which the memory cells at the address are electrically coupled to the sense amplifiers, and in which the memory cells at the address are electrically decoupled from the sense amplifiers in response to a timing signal.

29 Claims, 6 Drawing Sheets

(56) References Cited

U.S. PATENT DOCUMENTS

2014/0281770 A1  9/2014  Kim et al.
2016/0350240 A1  12/2016  Grafton et al.

FOREIGN PATENT DOCUMENTS

WO    2007110716 A1   10/2007
WO    2010143209 A1   12/2010

OTHER PUBLICATIONS

Gupta, Anil, "New Architecture for Code-Shadowing Applications, Dual-buffer SPI-NAND Arch providing SPI-NOR compatibility," Flash Memory Summit Presentation materials, Aug. 13, 2013, 14 pages.
Intel Application Note AP-684, "Understanding the Flash Translation Layer (FTL) Specification," Dec. 1998, 20 pages.
Macronix—MX29GL256F Data Sheet, 3V (VI-O), 256Mb, v1.5; Oct. 30, 2013, 72 pages.
Macronix—MX25L6455EMI-10G-datasheet, Rev. 1.4, Feb. 10, 2012, 82 pages.
Silicon Storage Technology, Inc., 16 Mbit SPI Serial Flash, SST25VF016B, Data Sheet, Jan. 2011, 31 pages.

\* cited by examiner

CIRCUIT AND METHOD FOR READ LATENCY CONTROL

BACKGROUND

Field

The present invention relates to integrated circuit memory devices, and more particularly to circuitry for reading data from such memory devices.

Description of Related Art

A host controller communicates with a memory device using a communication interface such as the Serial Peripheral Interface bus (SPI). The host controller generates a read clock signal and selects a memory device via a chip select line. The read clock signal can have a range of frequencies that are supported by the memory device.

A typical read instruction sequence includes a read command and a start address. After issuing the read instruction sequence, the host controller needs to wait for a latency time for data output from the memory device. During the latency time, the memory device senses data stored in the memory device.

In one prior method, the latency time is controlled by the read clock signal and is dependent on the frequency of the read clock signal. With this method, the latency time may become longer than necessary for sensing the data stored in the memory device, and cause larger power consumption than necessary.

It is desirable to provide circuit and method for reducing the power consumption during a memory read operation.

SUMMARY

Device and method are provided herein to reduce the power consumption of the memory device during a read operation.

A memory device is provided that comprises an array of memory cells, and a plurality of sense amplifiers coupled with the memory cells. A controller is configured to execute a read operation in response to a command and address received on the second port, including a read cycle in which the memory cells at the address are electrically coupled to the sense amplifiers, and in which the memory cells at the address are electrically decoupled from the sense amplifiers in response to a timing signal.

For instance, in a NAND flash architecture, an array of memory cells can include a block of memory cells arranged in a plurality of strings of memory cells. The strings of memory cells have respective string select switches coupled with respective bit lines. In this instance, electrically coupling the memory cells to the sense amplifiers can include applying bias voltages to addressed memory cells, string select switches coupled to the strings of memory cells including the addressed memory cells, and sense amplifiers coupled to the addressed memory cells, to allow current flow from the addressed memory cells to respective sense amplifiers. In a NAND flash architecture, electrically decoupling the memory cells to the sense amplifiers in response to a timing signal can include turning off the bias voltages to the addressed memory cells, the string select switches and the sense amplifiers, to stop current flow from the addressed memory cells to respective sense amplifiers and de-energized the sense amplifiers.

Turning off the bias voltages is in response to a timing signal. In other words, turning off the bias voltages is set in motion by the timing signal, but may not be strictly aligned in time with the timing signal. For example, the bias voltages can be turned off within one cycle in the read clock signal in response to the timing signal.

For instance, in a NOR flash architecture, a memory device can include a plurality of stacks of semiconductor strips over a substrate, a plurality of word lines arranged orthogonally over the plurality of stacks, a plurality of memory cells between surfaces of the plurality of stacks and the plurality of word lines, a plurality of bit lines coupled to multiple locations along each of the semiconductor strips of the plurality of stacks, and a plurality of source lines coupled to multiple locations along each of the semiconductor strips of the plurality of stacks, wherein the plurality of bit lines and the plurality of source lines are between adjacent ones of the plurality of word lines.

In a NOR flash architecture, electrically coupling the memory cells to the sense amplifiers can include applying bias voltages to bit lines, word lines and source lines coupled to addressed memory cells, and sense amplifiers coupled to the bit lines, to allow current flow from the addressed memory cells to respective sense amplifiers. In this instance, electrically decoupling the memory cells to the sense amplifiers in response to a timing signal can include turning off the bias voltages to the bit lines, word lines and source lines coupled to the addressed memory cells, and the sense amplifiers, to stop current flow from the addressed memory cells to respective sense amplifiers and de-energized the sense amplifiers.

Circuitry to generate the timing signal includes a first delay circuit generating a first signal having a first delay based on a frequency of a read clock signal, a second delay circuit generating a second signal having a second delay independent of the frequency of the read clock signal, and a selector circuit to generate the timing signal in response to the first signal if the first delay is shorter than the second delay, or in response to the second signal if the second delay is shorter than the first delay. The selector circuit can include a logic AND gate having inputs receiving the first signal at the first delay and the second signal at the second delay, and an output producing the timing signal.

The memory device includes a first port for the read clock signal having the frequency, and a second port for address, data and command signals synchronized with the read clock signal. The memory device includes a plurality of data latches coupled with the plurality of sense amplifiers, the data latches storing read data from the memory cells at the address after the memory cells at the address are electrically decoupled from the sense amplifiers until at least the read data is outputted from the second port.

The first port can be an external port to the memory device, and the read clock signal is provided by a source off the chip on the external port. The second port can be an external port to the memory device, including one or more external pins to the memory device.

As used herein, a sensing time in a read operation refers to the time between receiving all the bits of the address required for the read from an external source, and developing a signal representing the first data sensed that is suitable to be provided to output circuits that provide clocked output data. This sensing time can depend on a number of factors, and encompass a variety of read operations in the device including decoding an address, word line and bit line charging, applying sensing current through the memory cells, and operating sensing circuits to develop a reliable signal for worst case signal path through the memory circuits.

The frequency of the read clock signal is in a range from a lower read clock frequency to a higher read clock frequency. The first delay based on the higher read clock frequency is longer than a sensing time and shorter than the second delay, and the second delay is longer than the sensing time and shorter than the first delay based on the lower read clock frequency. The sensing time is between receiving all bits of the address from the first port and developing a signal representing first data sensed to be provided to the second port.

The first delay can begin on a particular cycle in the read clock signal and has a duration corresponding to a predetermined number of cycles in the read clock signal. The second delay can begin on the particular cycle in the read clock signal and has a fixed duration. The address is received in a set of address cycles in the read clock signal, and the particular cycle in the read clock signal is subsequent to a last cycle in the set of address cycles. Read data from the memory cells at the address is outputted from the second port in a set of data output cycles in the read clock signal, and the memory cells at the address are electrically decoupled from the sense amplifiers before a first cycle in the set of data output cycles. The timing signal is generated during a latency starting on a last cycle in the set of address cycles and ending on a first cycle in the set of data output cycles, the latency having a duration corresponding to a predetermined number of cycles in the read clock signal.

A circuit is described that comprises a first delay circuit generating a first signal having a first delay based on a frequency of a read clock signal, a second delay circuit generating a second signal having a second delay independent of the frequency of the read clock signal, and a selector circuit to generate a timing signal in response to the first signal if the first delay is shorter than the second delay, or in response to the second signal if the second delay is shorter than the first delay.

Methods for operating a memory device as described herein are also provided.

Other aspects and advantages of the present invention can be seen on review of the drawings, the detailed description and the claims, which follow.

DETAILED DESCRIPTION

The following description will typically be with reference to specific structural embodiments and methods. It is to be understood that there is no intention to limit the technology to the specifically disclosed embodiments and methods but that the technology may be practiced using other features, elements, methods and embodiments. Preferred embodiments are described to illustrate the present technology, not to limit its scope, which is defined by the claims. Those of ordinary skill in the art will recognize a variety of equivalent variations on the description that follows.

Figure 1:
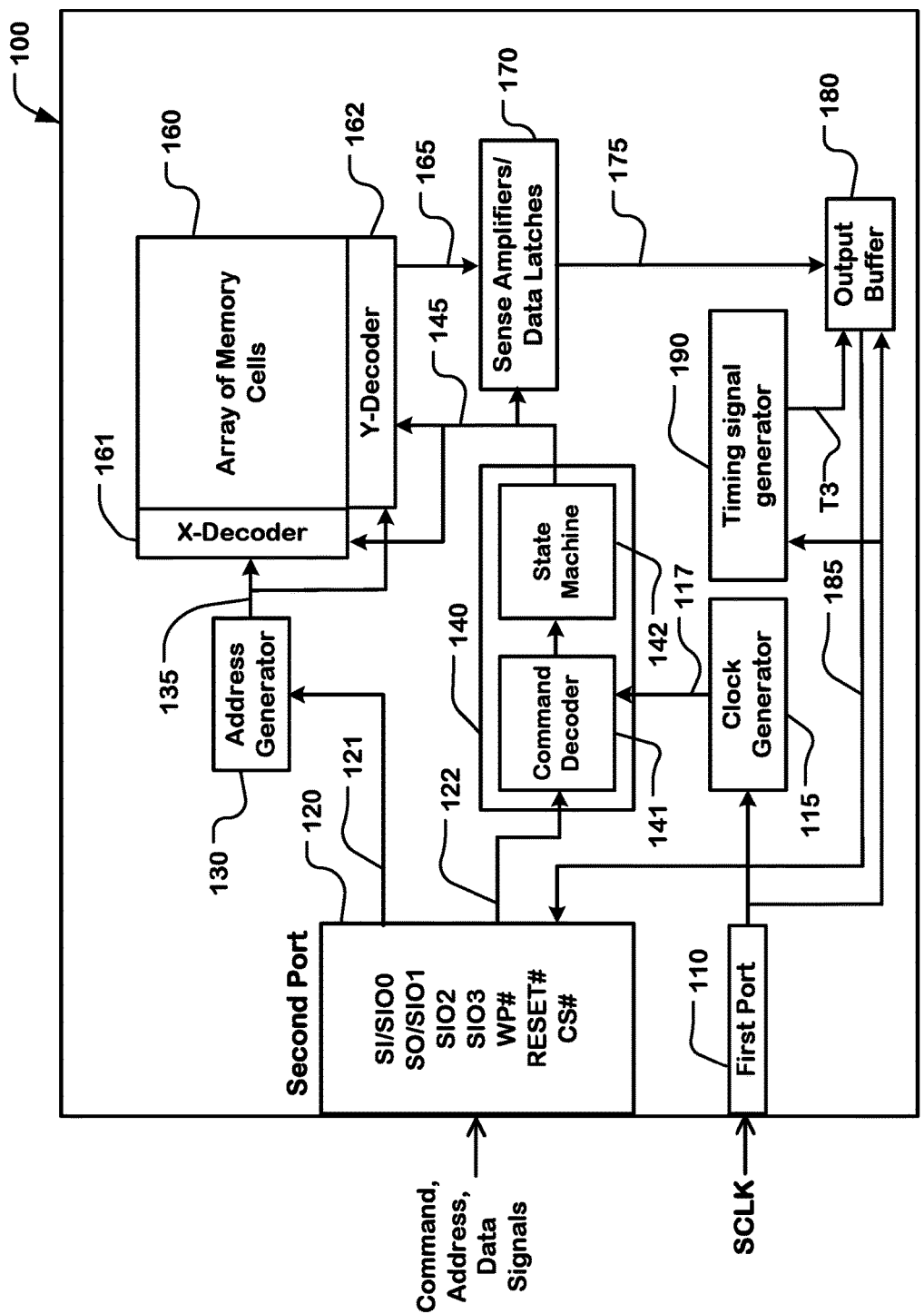
FIG. 1 is a simplified block diagram of an integrated circuit memory device.

FIG. 1 is a simplified block diagram of a memory device 100 that includes an array of memory cells 160, a plurality of sense amplifiers in a page buffer 170 coupled with the memory cells, a first port 110, and a second port 120. The first port 110 is for a read clock signal SCLK having a frequency in a range of read clock frequencies from a lower read clock frequency to a higher read clock frequency. The first port is an external port to the memory device, and the read clock signal is provided by an off chip source to the first port. In this example, the memory device 100 can include a serial interface through which the read command, addresses and data are communicated. The serial interface can be based on a Serial Peripheral Interface (SPI) bus in which the command channel shares the I/O ports used by address and data.

As used herein, an external port has one or more pins on an integrated circuit package encapsulating an integrated circuit device such as a memory device. External ports on an integrated circuit package can connect an integrated circuit device encapsulated by the package to a circuit board for off chip communication. For instance, signals provided by off chip sources to the external ports of the integrated circuit device can drive circuits inside an integrated circuit device via the external ports.

The second port 120 is for address, data and command signals synchronized with the read clock signal, and for other signals not synchronized with the read clock signal. The second port 120 is an external port to the memory device. The second port 120 can include multiple pins, including pins SI/SIO0, SO/SIO1, SIO2, SIO3, WP#, RESET#, CS#. Pins SI/SIO0, SO/SIO1, SIO2 and SIO3 are for serial data I/O (input and output) synchronized with the read clock signal. For instance, pin SI/SIO0 can be used for 1×I/O, pins SI/SIO0 and SO/SIO1 can be used for 2×I/O, and pins SI/SIO0, SO/SIO1, SIO2 and SIO3 can be used for 4×I/O. Pin WP# is for write protection and can be the same pin as for SIO2. Pin RESET# is for hardware reset and can be the same pin as for SIO3. Pin CS# is for chip select.

The memory device 100 includes a controller 140. The controller 140 is configured to execute a read operation in response to a command and address received on the second port 120, including a read cycle in which the memory cells at the address are electrically coupled to the sense amplifiers, and in which the memory cells at the address are electrically decoupled from the sense amplifiers in response to a timing signal T3. The controller 140 provides signals 145 to control other circuits of the memory device 100, e.g. X-decoder 161, Y-decoder 162, and sense amplifiers and the page buffer 170, to carry out the various operations described herein. Read operations by the controller 140 include receiving the address on the second port synchronized with the read clock signal, decoding the address, electrically coupling the memory cells at the address, electrically decoupling the memory cells at the address from the sense amplifiers in the read cycle in response to the timing signal.

The controller 140 includes a command decoder 141 including logic supporting sequential read commands received on the second port 120 and a state machine 142. Clock generator 115 can receive the read clock signal SCLK, and provide an internal clock 117 to the command decoder for decoding commands received from the second port 120. The controller can be implemented using special-purpose logic circuitry as known in the art. In other embodiments, the controller comprises a general purpose processor, which may be implemented on the same memory device 100, which executes a computer program to control the operations of the device. In yet other embodiments, a combination of special purpose logic circuitry and a general purpose processor may be utilized for implementation of the controller.

Timing signal generator 190 generates a timing signal T3. Timing signal generator 190 can include a first delay circuit, a second delay circuit and a selector circuit, as further described in reference to FIG. 3. The first delay circuit can receive a read clock signal SCLK having the read clock frequency, and generate the first signal at the first delay. The first delay can begin on a particular cycle in the read clock signal and have a duration corresponding to a predetermined number of cycles in the read clock signal. The second delay circuit can generate the second signal having the second delay. The second delay can begin on the particular cycle in the read clock signal SCLK and have a fixed duration. The selector circuit can receive the first signal at the first delay and the second signal at the second delay, and produce the timing signal T3 corresponding to the shorter one of the first and second delays.

Address signals are supplied to the memory device 100 on the second port 120 synchronized with the read clock signal SCLK, and provided to an address generator 130 via a line 121. The address generator 130 provides addresses 135 to X-decoder 161 and Y-decoder 162. X-decoder 161 and Y-decoder 162 in turn are coupled to the array of memory cells 160. The array 160 can have a NOR architecture, a NAND architecture or other architectures.

Bit lines 165 in the array 160 are coupled to a plurality of sense amplifiers in the page buffer 170 in this example, which in turn is coupled to output buffer 180 via a line 175. The output buffer 180 is coupled to the second port 120 via a line 185. The page buffer 170 can include a plurality of data latches coupled with the plurality of sense amplifiers for each bit line connected. The address decoders 161 and 162 can select and couple specific memory cells in the array 160 via respective connecting bit lines to the page buffer in the page buffer 170. The page buffer 170 can then store data that is sensed from or written to these specific memory cells in the data latches. Read data from the memory cells at the address are stored in the data latches after the memory cells at the address are electrically decoupled from the sense amplifiers until at least the read data is outputted from the second port.

A read command is supplied to the memory device 100 on the second port 120 according to the SPI protocol and provided to the command decoder 141 via the line 122. The command decoder 141 decodes the received read command. The command decoder 141 can also set a state for the memory device 100 in the state machine 142 based on the decoded read command. Based on the state in the state machine 142, the controller 140 provides signals to the address decoders 161 and 162, a page buffer 170, or other circuits in the memory device 100 to carry out one or more operations corresponding to the state stored in the state machine 142.

The data stored in the array 160 can be addressed in blocks of bytes or in other suitable block sizes such as blocks of 4 bytes, or blocks of 8 bytes, and so on. Each block can have an address in the array 160. A block of data can be read from the memory device 100 by providing the memory device 100 a read request including a read command and an address for the block of data.

The memory device 100 supports a sequential read state. While in a sequential read state, the memory device 100 automatically outputs blocks of data that have sequential addresses in the array 160 as long as the SCLK remains active. For example, after a first byte of data (e.g., at an address "03FFF2" in hexadecimal) is outputted from the second port 120, the memory device 100 automatically outputs a second byte of data at an address "03FFF3" that is sequential to the address of the first byte. The memory continues to output bytes of data at addresses that are sequential to the addresses of previously outputted bytes (e.g., "03FFF5", "03FFF6", "03FFF7", and so on) until the SCLK stops, or until the state changes out of the sequential read state.

Figure 2:
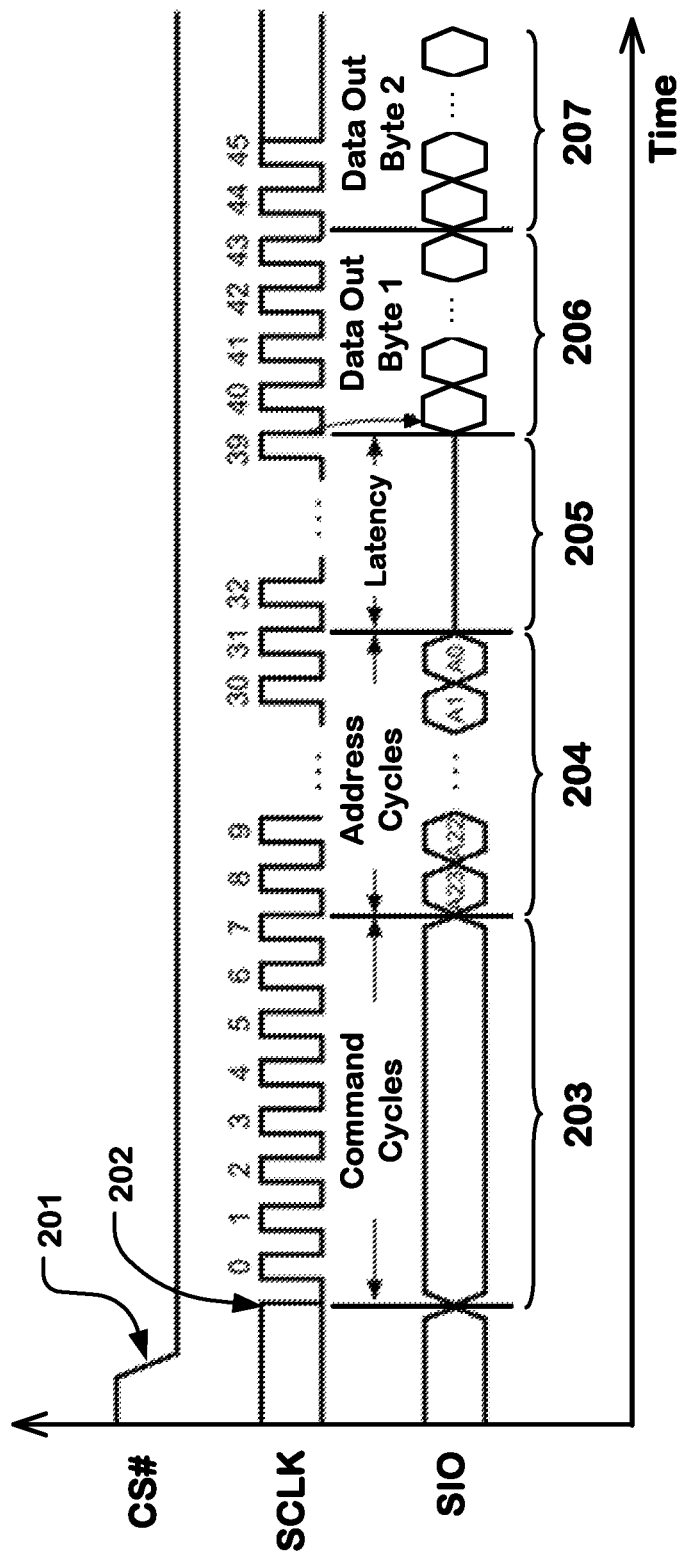
FIG. 2 is a timing diagram illustrating a read operation on the memory device.

FIG. 2 is a timing diagram illustrating a read operation on the memory device 100. In this example, at instance 201, the chip enable signal CS# is changed from high to low. When the chip enable signal CS# is held low, the memory device 100 is in an active mode and is available for receiving and processing input signals. A read clock signal SCLK is provided to the memory device 100 via the first port 110 (FIG. 1) at instance 202. The memory device 100 inputs or outputs data by latching input/output data bits to the read clock signal SCLK.

As illustrated in the example shown in FIG. 2, during command cycles 203 following the instances 201 and 202, a command code of a byte or a sequence of bytes (e.g., a binary code "00000011" for a sequential read command) is provided to the memory device 100 on the input data line connected to the second port 120. In this example, each bit of the command code is latched on a rising edge of the read clock signal SCLK (e.g., the command cycles 203 have 8 clock cycles for the binary code "00000011"). Alternatively, each bit of the command code can be latched on a falling edge of the read clock signal SCLK, as suitable for the design of a particular memory device.

In this example, the command decoder 141 (FIG. 1) decodes the received command code (e.g., the binary code "00000011") and determines that it is a sequential read command. After determining the sequential read command, the command decoder 141 sets a sequential read state in the state machine 142. Meanwhile, the command decoder 141 or other modules of the controller 140 (FIG. 1) decodes the subsequent byte or bytes received via the input data line connected to the input/output second port 120 during the address cycles 204 as a starting address for the data stored in the array 160 requested by the sequential read command. For example, a 3-byte address (e.g., "03FFF2" in hexadecimal) can be provided to the memory device 100 via the input data line connected to the second port 120 during the address cycles 204. In this example, each bit of the 3-byte address is latched on a rising edge of the read clock signal SCLK (i.e., the address cycles 204 have 24 clock cycles for the 3-byte address). Alternatively, each bit of the 3-byte address can be latched on a falling edge of the read clock signal SCLK, as suitable for the design of a particular memory device.

During a latency 205 after the address is received, the memory device 100 can sense the data stored at the received address in the array of memory cells 160 in the memory device 100. After the latency 205, the memory device 100 can output the sensed data in a set of data output cycles in the read clock signal. The read clock signal SCLK can have a range of read clock frequencies from a lower read clock frequency to a higher read clock frequency. The address is received in a set of address cycles in the read clock signal, and sensed data is outputted in a set of data output cycles. The latency can start on the last cycle in the set of address cycles, and end on the first cycle in the set of data output cycles. Generation of the timing signal is described in reference to FIG. 4 for a higher read frequency, and in reference to FIG. 5 for a lower read frequency.

The memory device 100 can output data sequentially, starting with a first block of data at the starting address of the sequential read command. For example, the controller 140 can provide the starting address and an output block size (e.g., a byte) to the address decoder 161 (FIG. 1). The address decoder 161 selects the memory cells in the array 160 that correspond to the byte at the starting address, and couples the selected memory cells to the page buffer 170. The controller 140 also sends control signals to the page buffer 170 via a line 145. The output buffer 180 sends the first byte of data stored in the selected memory cells to the second port 120 via a line 185. In this example, each bit of the first byte of data is latched on a falling edge of the read clock signal SCLK and shifted out to the output data line connected to the second port 120. Alternatively, each bit of the first byte of data can be latched on a rising edge of the read clock signal SCLK and shifted out to the output data line connected to the second port 120, as suitable for the design of a particular memory device. In this example, the first byte of data ("Data Out byte 1" shown in FIG. 2) at the starting address (e.g., "03FFF2" in hexadecimal) of the sequential read command is outputted in 8 clock cycles during the time period 206 illustrated in FIG. 2.

In the sequential read state, the memory device 100 continues outputting data sequentially after the first byte of data, if the read clock signal SCLK is running and the chip enable signal CS# is held low, without requiring additional command and address data at the second port 120. For example, after the first byte of data (at the address "03FFF2" in hexadecimal) is outputted, the second byte of data at an address (e.g., "03FFF3" in hexadecimal) sequential to the address of the first byte of data is outputted to the second port 120. Each bit of the second byte of data is latched on a falling edge of the read clock signal SCLK and shifted out to the output data line connected to the second port 120. Here, the second byte of data ("Data Out byte 2" shown in FIG. 2) is outputted in 8 clock cycles during the time period 207 illustrated in FIG. 2.

The sequential read state can be terminated by changing the chip enable signal CS# from low to high. When the chip enable signal CS# is held high, the memory device 100 is in an inactive mode and stops outputting data. The memory device 100 can change state of the state machine 142 out of the sequential read state after the chip enable signal CS# is changed from low to high.

The sequential data output illustrated by FIG. 2 can be suspended by stopping the read clock signal SCLK, while holding the chip enable signal CS# low. In this way, the sequential read state is pause or preserved in the state machine 142 and the sequential data output is suspended. The sequential data output can be resumed by resuming the read clock signal SCLK.

Figure 3:
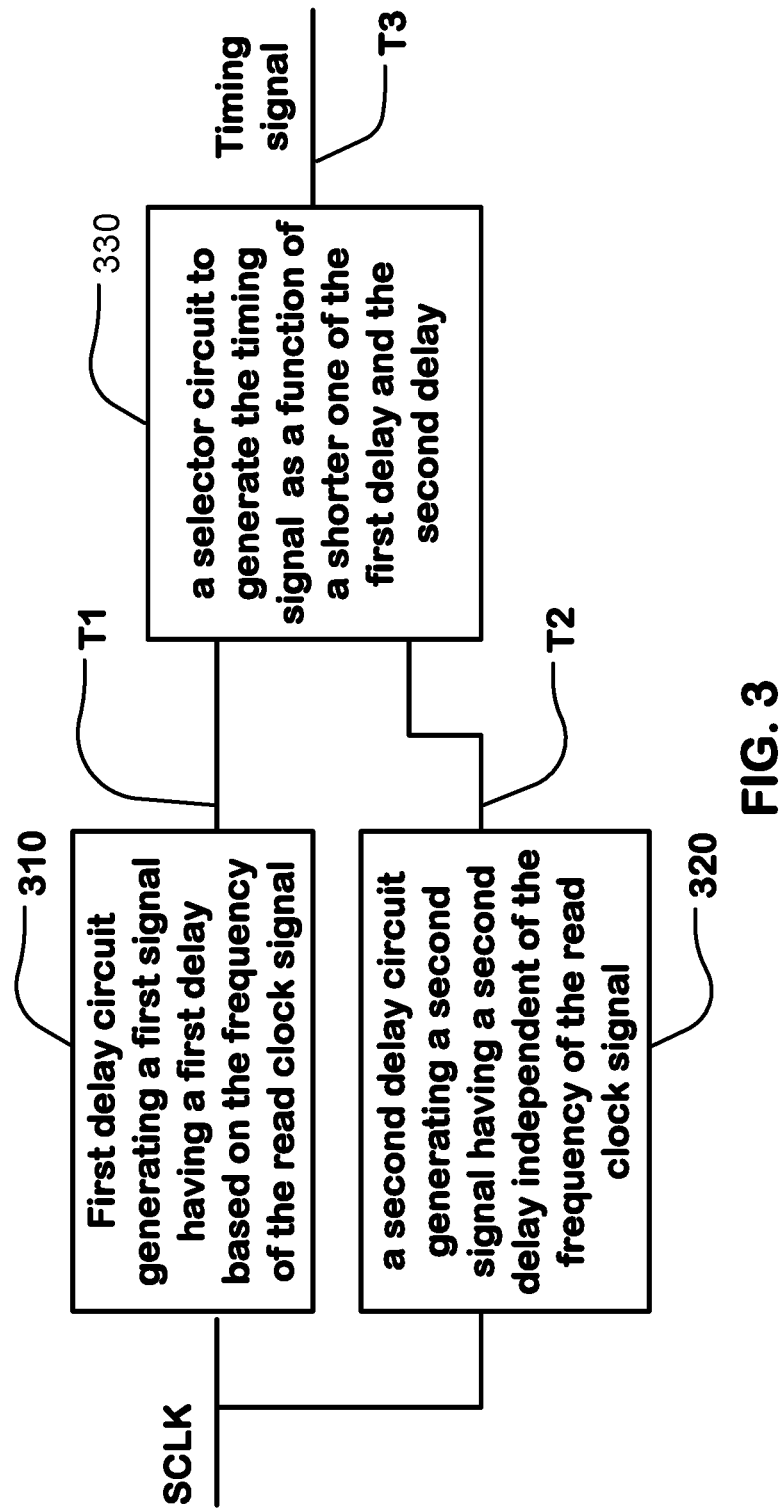
FIG. 3 illustrates circuitry to generate the timing signal.

FIG. 3 illustrates circuitry to generate the timing signal. The circuitry can include a first delay circuit 310, a second delay circuit 320, and a selector circuit 330.

The first delay circuit 310 can receive a read clock signal SCLK having a read clock frequency in a range of read clock frequencies from a lower read clock frequency to a higher read clock frequency, and generate a first signal T1 having a first delay D1 (FIGS. 4 and 5) based on the frequency of the read clock signal SCLK. The first delay can begin on a particular cycle in the read clock signal and has a duration corresponding to a predetermined number of cycles in the read clock signal SCLK. For instance, a counter synchronized with the read clock signal can generate a pulse having a pulse width corresponding to the predetermined number of cycles in the read clock signal, to indicate the first delay.

The number of cycles in the read clock signal SCLK for the first delay D1 is predetermined such that, the first delay (D1, FIG. 4) based on the higher read clock frequency is longer than the sensing time (D0, FIG. 4) and shorter than the second delay (D2, FIG. 4), and the second delay (D2, FIG. 5) is longer than the sensing time (D0, FIG. 5) and shorter than the first delay based on the lower read clock frequency.

Figure 4:
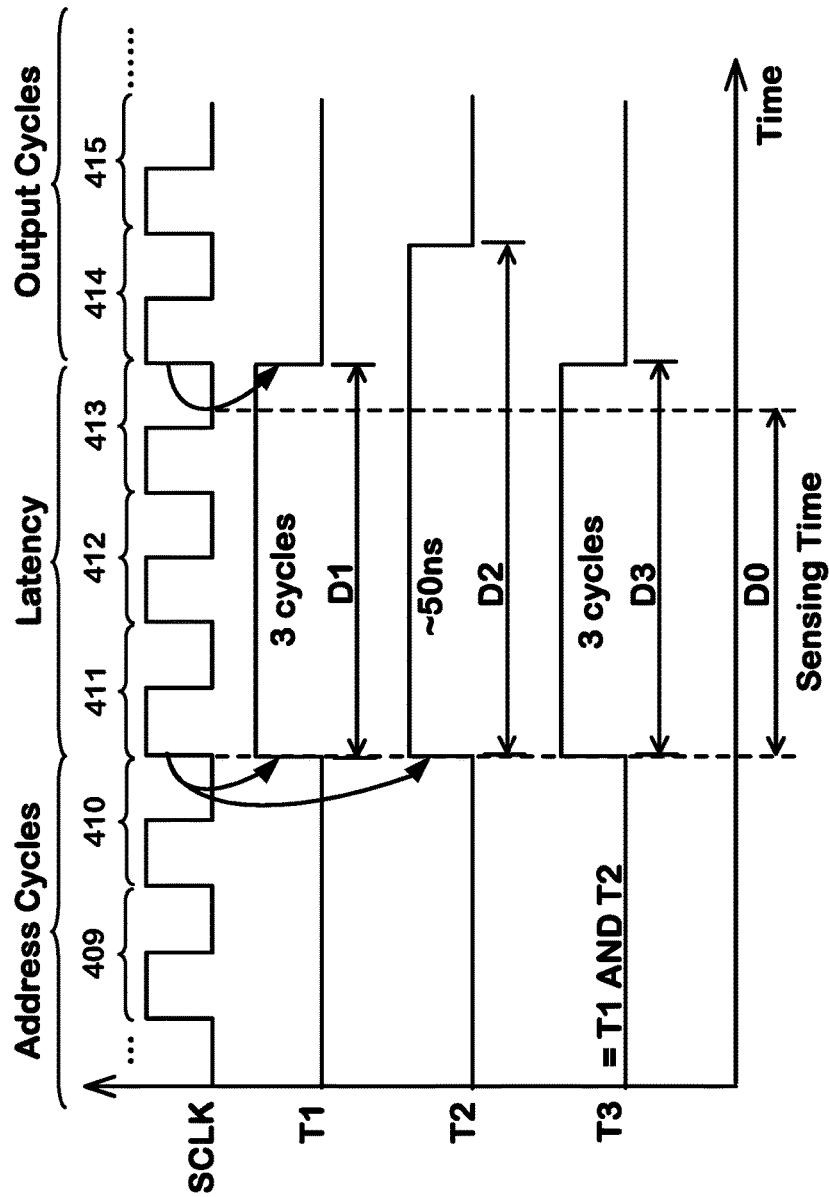
FIG. 4 is a timing diagram illustrating generating a timing signal when a read clock signal has a higher read clock frequency.
Figure 4:
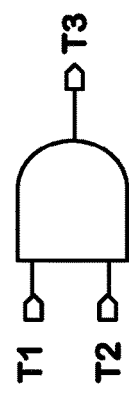
Figure 5:
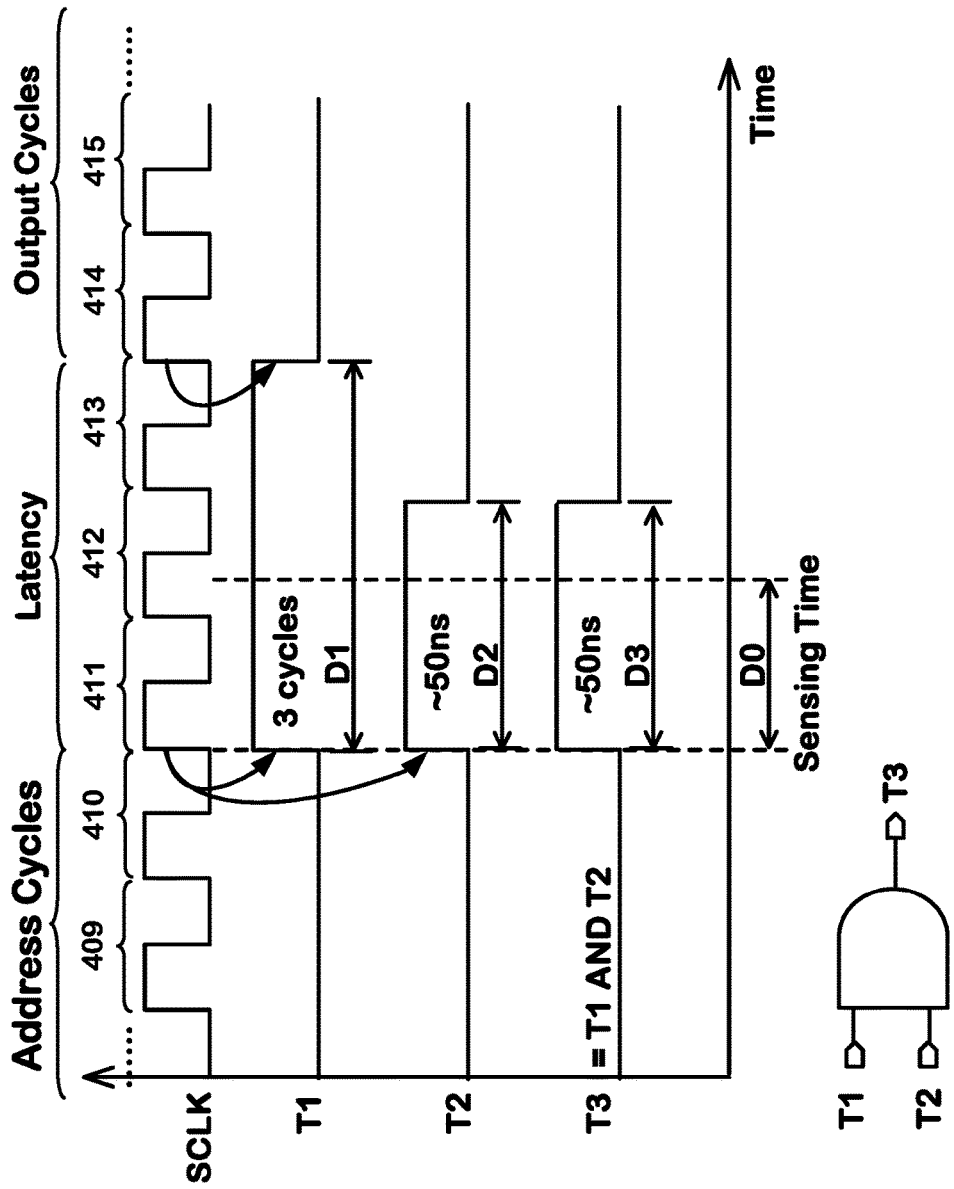
FIG. 5 is a timing diagram illustrating generating a timing signal when a read clock signal has a lower read clock frequency.

The second delay circuit 320 can receive the read clock signal SCLK and generate the second signal T2 at the second delay D2 (FIGS. 4 and 5). The second delay can begin on the particular cycle in the read clock signal as the first delay D1 and has a fixed duration. For instance, the second delay circuit can include an AND gate and an inverting delay line having the fixed duration. The AND gate can have a first input receiving an input signal that begins on the particular cycle in the read clock signal. The inverting delay line can have an input receiving the input signal and an output producing a delayed and inverted signal from the input signal. The AND gate can have a second input receiving the delayed and inverted signal from the inverting delay line. When the input signal is toggled from a low voltage level to a high voltage level, the AND gate can produce a one shot signal at its output representing the second delay. The selector circuit 330 can receive the first signal having the first delay and the second signal having the second delay. The selector circuit 330 can generate the timing signal in response to the first signal if the first delay is shorter than the second delay, or in response to the second signal if the second delay is shorter than the first delay.

Depending on the pulse polarity of the first signal T1, the second signal T2, and the timing signal T3, the selector circuit 330 can include a suitable logic gate having inputs receiving the first signal T1 having the first delay and the second signal T2 having the second delay, and an output producing the timing signal T3. In one embodiment as illustrated in FIG. 4, the first signal T1 has a first positive pulse representing the first delay D1, the second signal T2 has a second positive pulse representing the second delay D2, and the timing signal T3 has a third positive pulse D3 corresponding to a shorter one of the first delay D1 and the second delay D2. In this embodiment, the selector circuit 330 can include a logic AND gate having inputs receiving the first signal T1 at the first delay and the second signal T2 at the second delay, and an output producing the timing signal T3 in response to the first signal if the first delay is shorter than the second delay, or in response to the second signal if the second delay is shorter than the first delay.

In an alternative embodiment, the first signal T1 can have a first negative pulse representing the first delay D1, the second signal T2 can have a second negative pulse representing the second delay D2, and the timing signal T3 can have a third negative pulse D3 corresponding to a shorter one of the first delay D1 and the second delay D2. In this alternative embodiment, the selector circuit 330 can include a logic NOR gate having inputs receiving the first signal T1 at the first delay and the second signal T2 at the second delay, and an output producing the timing signal T3 in response to the first signal if the first delay is shorter than the second delay, or in response to the second signal if the second delay is shorter than the first delay.

People with ordinary skill in the art can implement the present technology using other combinations of pulse polarities for the first signal, the second signal and the timing signal, with suitable logic gates to receive the first signal T1 at the first delay and the second signal T2 at the second delay, and to produce the timing signal T3 as described herein.

FIG. 4 is a timing diagram illustrating generating a timing signal when a read clock signal has a higher read frequency. The memory device comprises an array of memory cells, a plurality of sense amplifiers coupled with the memory cells, a first port for a read clock signal SCLK having a frequency in a range of read clock frequencies from a lower read clock frequency to a higher read clock frequency, and a second port for address, data and command signals synchronized with the read clock signal. In this example, a read clock signal SCLK having a higher read clock frequency is received at a memory device 100 via the first port 110 (FIG. 1). An address is received at the second port 120 (FIG. 1) in a set of address cycles (e.g. 409, 410) in the read clock signal, including a last cycle 410.

The data from the memory cells at the address in the array of memory cells is sensed during a sensing time D0 after the address is received.

A first signal T1 having a first delay D1 is generated based on the read clock frequency of the read clock signal SCLK. The first delay D1 can begin on a particular cycle 411 in the read clock signal and has a duration corresponding to a predetermined number of cycles in the read clock signal. Although in this example, a predetermined number of cycles in the read clock has 3 cycles (e.g. 411, 412, 413), the predetermined number can be greater than or less than 3 cycles corresponding to a longer or shorter first delay D1, as suitable for the design of a particular memory device. Although in this example, the first signal T1 begins on a rising edge of a particular cycle, alternatively the first signal T1 can begin on a falling edge of a particular cycle as suitable for the design of a particular memory device.

A second signal T2 at a second delay D2 is generated based on a second delay circuit independent of the read clock frequency. For instance, the second delay D2 can be about 50 ns (nanoseconds). The second delay D2 can begin on the particular cycle 411 in the read clock signal as the first delay D1 and have a fixed duration. For instance, the second delay D2 can begin on a leading edge of the particular cycle 411 in the read clock signal SCLK. In one embodiment, the leading edge can be a rising edge as shown in this example. In alternative embodiments, the leading edge can be a falling edge.

A timing signal T3 is generated in response to the first signal if the first delay is shorter than the second delay, or in response to the second signal if the second delay is shorter than the first delay. In this example, the first delay D1 based on the higher read clock frequency is shorter than the second delay D2. For instance, the second delay D2 is about 50 ns, and the read clock signal has a higher frequency of 100 MHz corresponding to a cycle of 10 ns or 3 cycles of 30 ns for the first delay D1. Consequently the timing signal T3 is generated in response to the first signal T1 which has a shorter first delay D1=30 ns than the second delay D2=50 ns of the second signal T2.

The memory device comprises a plurality of data latches coupled with the plurality of sense amplifiers. Read data from the memory cells at the address is stored in the data latches after the memory cells at the address are electrically decoupled from the sense amplifiers until at least the read data is outputted from the second port.

A higher read clock frequency corresponds to shorter cycles in a predetermined number of cycles in the read clock signal, and can result in the first delay D1 of the first signal T1 being shorter than the second delay D2 of the second signal T2. For the higher read clock frequency, the timing signal T3 is generated in response to the first signal T1.

Depending on the pulse polarities of the first signal T1, the second signal T2, and the timing signal T3, the timing signal T3 can be produced by executing a suitable logic function receiving the first signal T1 and the second signal T2. In one embodiment as illustrated in FIG. 4, the first signal T1 has a first positive pulse representing the first delay D1, the second signal T2 has a second positive pulse representing the second delay D2, and the timing signal T3 has a third positive pulse D3 corresponding to a shorter one of the first delay D1 and the second delay D2. In this embodiment, the timing signal T3 can be produced by executing a logic AND function receiving the first signal T1 at the first delay D1 and the second signal T2 at the second delay D2.

In an alternative embodiment, the first signal T1 can have a first negative pulse representing the first delay D1, the second signal T2 can have a second negative pulse representing the second delay D2, and the timing signal T3 can have a third negative pulse D3 corresponding to a shorter one of the first delay D1 and the second delay D2. In this alternative embodiment, the timing signal T3 can be produced by executing a logic NOR function receiving the first signal T1 at the first delay D1 and the second signal T2 at the second delay D2.

People with ordinary skill in the art can implement the present technology using other combinations of pulse polarities for the first signal, the second signal and the timing signal, with suitable logic functions to receive the first signal T1 at the first delay and the second signal T2 at the second delay, and to produce the timing signal T3 as described herein.

The address is received in a set of address cycles in the read clock signal, including a last cycle 410 in the set of address cycles. The particular cycle 411 in the read clock signal, on which the first delay D1 and the second delay D2 begin, is subsequent to the last cycle 410 in the set of address cycles.

The read data from the memory cells at the address is outputted from the second port (120, FIG. 1) in a set of data output cycles (e.g. 414, 415) in the read clock signal. The memory cells at the address are electrically decoupled from the sense amplifiers before a first cycle 414 in the set of data output cycles.

FIG. 5 is a timing diagram illustrating generating a timing signal when a read clock signal has a lower read clock frequency. The memory device comprises an array of memory cells, a plurality of sense amplifiers coupled with the memory cells, a first port for a read clock signal SCLK having a frequency in a range of read clock frequencies from a lower read clock frequency to a higher read clock frequency, and a second port for address, data and command signals synchronized with the read clock signal. In this example, a read clock signal SCLK having a lower read clock frequency is received at a memory device 100 via the first port 110 (FIG. 1). An address is received at the second port 120 (FIG. 1) in a set of address cycles (e.g. 409, 410) in the read clock signal, including a last cycle 410.

The data from the memory cells at the address in the array of memory cells is sensed during a sensing time D0 after the address is received.

A first signal T1 at a first delay D1 is generated based on the read clock frequency of the read clock signal SCLK. Further description about the first signal T1 is provided in reference to FIG. 4 and is not repeated here.

A second signal T2 at a second delay D2 is generated based on a second delay circuit independent of the read clock frequency. Further description about the second signal T2 is provided in reference to FIG. 4 and is not repeated here.

A timing signal T3 is generated in response to the first signal if the first delay is shorter than the second delay, or in response to the second signal if the second delay is shorter than the first delay. In this example, the second delay D2 is shorter than the first delay D1 based on the lower read clock frequency. For instance, the second delay D2 is about 50 ns, and the read clock signal has a lower frequency of 50 MHz corresponding to a cycle of 20 ns or 3 cycles of 60 ns for the first delay D1. Consequently the timing signal T3 is generated in response to the second signal T2 which has a shorter second delay D2=50 ns than the first delay D1=60 ns of the first signal T1.

The memory device comprises a plurality of data latches coupled with the plurality of sense amplifiers. Read data from the memory cells at the address is stored in the data latches after the memory cells at the address are electrically decoupled from the sense amplifiers until at least the read data is outputted from the second port in a set of output cycles (e.g. 414, 415). Consequently, when a read clock has a lower read clock frequency, power consumption can be reduced between the time when the memory cells at the address are electrically decoupled from the sense amplifiers in response to the timing signal T3, and the time when the read data stored in the data latches is provided to the second port.

A lower read clock frequency corresponds to longer cycles in a predetermined number of cycles in the read clock signal, and can result in the first delay D1 of the first signal T1 being longer than the second delay D2 of the second signal T2. For the lower read clock frequency, the timing signal T3 is generated in response to the second signal T2.

In one embodiment as illustrated in FIG. 5, where the first signal T1, the second signal T2, and the timing signal T3 have positive pulse widths, the timing signal T3 can be produced by executing a logic AND function receiving the first signal T1 at the first delay and the second signal T2 at the second delay. Depending on whether the first signal T1, the second signal T2, and the timing signal T3 have positive/negative pulse widths, different logic functions suitable for implementing the present technology can be used, as described in reference to FIG. 4.

The address is received in a set of address cycles in the read clock signal, including a last cycle 410 in the set of address cycles. The particular cycle 411 in the read clock signal, on which the first delay D1 and the second delay D2 begin, is subsequent to the last cycle 410 in the set of address cycles.

The read data from the memory cells at the address is outputted from the second port (120, FIG. 1) in a set of data output cycles (e.g. 414, 415) in the read clock signal. The memory cells at the address are electrically decoupled from the sense amplifiers in response to the timing signal T3, before a first cycle 414 in the set of data output cycles.

Figure 6:
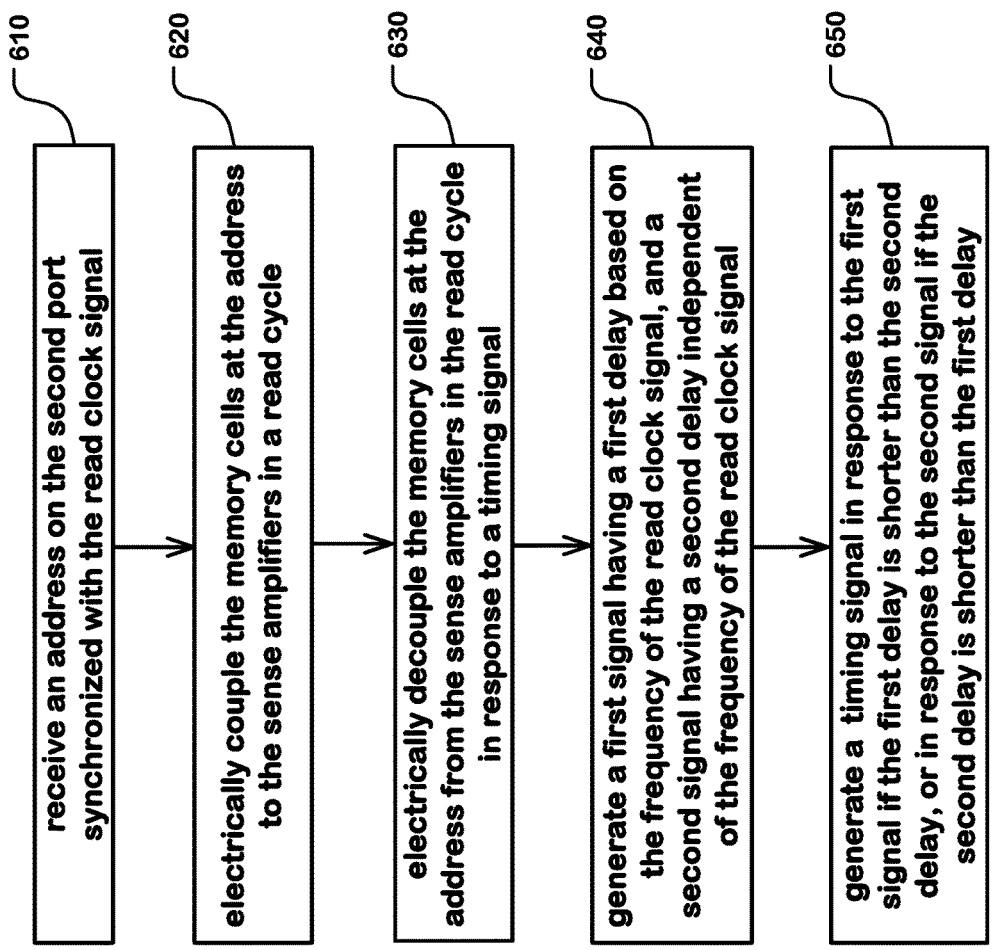
FIG. 6 is an example flow chart illustrating a method for reading a memory device.

FIG. 6 is an example flow chart illustrating a method for reading a memory device. The memory device comprises an array of memory cells, a plurality of sense amplifiers coupled with the memory cells, a first port for a read clock signal having a frequency in a range of read clock frequencies from a lower read clock frequency to a higher read clock frequency, and a second port for address, data and command signals synchronized with the read clock signal. At Step 610, an address is received on the second port synchronized with the read clock signal. At Step 620, the memory cells at the address is coupled to the sense amplifiers in a read cycle. At Step 630, the memory cells at the address is decoupled from the sense amplifiers in the read cycle in response to a timing signal.

At Step 640, a first signal having a first delay based on the frequency of the read clock signal is generated, and a second signal having a second delay independent of the frequency of the read clock signal is generated. At Step 650, a timing signal is generated in response to the first signal if the first delay is shorter than the second delay, or in response to the second signal if the second delay is shorter than the first delay.

The memory device comprises a plurality of data latches coupled with the plurality of sense amplifiers. Read data from the memory cells at the address is stored in the data latches after the memory cells at the address are electrically decoupled from the sense amplifiers until at least the read data is outputted from the second port.

The first delay based on the higher read clock frequency (D1, FIG. 4) is longer than a sensing time (D0, FIG. 4) and shorter than the second delay (D2, FIG. 4), and the second delay (D2, FIG. 5) is longer than the sensing time (D0, FIG. 5) and shorter than the first delay based on the lower read clock frequency (D1, FIG. 5). The sensing time is between receiving all bits of the address from the first port and developing a signal representing first data sensed to be provided to the second port.

The first delay can begin on a particular cycle in the read clock signal and have a duration corresponding to a predetermined number of cycles in the read clock signal, and the second delay can begin on the particular cycle in the read clock signal and have a fixed duration. The address is received in a set of address cycles in the read clock signal, and the particular cycle in the read clock signal is subsequent to a last cycle in the set of address cycles.

A logic AND function can be executed to receive the first signal at the first delay and the second signal at the second delay, and to produce the timing signal.

The present technology is applicable to other memory technologies, including DRAM (Dynamic Random Access Memory), NAND flash, NOR flash, RRAM (Resistive Random Access Memory) and PCRAM (Phase Change Random Access Memory).

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A memory device, comprising:
    an array of memory cells;
    a plurality of sense amplifiers coupled with the memory cells;
    a controller configured to execute a read operation in response to a command and address, including a read cycle in which the memory cells at the address are electrically coupled to the sense amplifiers, and in which the memory cells at the address are electrically decoupled from the sense amplifiers in response to a timing signal; and
    circuitry to generate the timing signal including a first delay circuit generating a first signal having a first delay based on a frequency of a read clock signal, a second delay circuit generating a second signal having a second delay independent of the frequency of the read clock signal, and a selector circuit to generate the timing signal in response to the first signal if the first delay is shorter than the second delay, or in response to the second signal if the second delay is shorter than the first delay.

2. The memory device of claim 1, comprising:
a first port for the read clock signal having the frequency;
a second port for address, data and command signals synchronized with the read clock signal; and
a plurality of data latches coupled with the plurality of sense amplifiers, the data latches storing read data from the memory cells at the address after the memory cells at the address are electrically decoupled from the sense amplifiers until at least the read data is outputted from the second port.

3. The memory device of claim 1, comprising:
a first port for the read clock signal having the frequency; and
a second port for address, data and command signals synchronized with the read clock signal,
wherein the frequency of the read clock signal is in a range from a lower read clock frequency to a higher read clock frequency, the first delay based on the higher read clock frequency is longer than a sensing time and shorter than the second delay, and the second delay is longer than the sensing time and shorter than the first delay based on the lower read clock frequency, the sensing time being between receiving all bits of the address from the first port and developing a signal representing first data sensed to be provided to the second port.

4. The memory device of claim 1, comprising:
a first port for the read clock signal having the frequency, wherein the first port is an external port to the memory device.

5. The memory device of claim 1, comprising:
a first port for the read clock signal having the frequency; and
a second port for address, data and command signals synchronized with the read clock signal,
wherein the second port is an external port to the memory device, including one or more external pins to the memory device.

6. The memory device of claim 1,
the first delay beginning on a particular cycle in the read clock signal and having a duration corresponding to a predetermined number of cycles in the read clock signal; and
the second delay beginning on the particular cycle in the read clock signal and having a fixed duration.

7. The memory device of claim 6, wherein the address is received in a set of address cycles in the read clock signal, and the particular cycle in the read clock signal is subsequent to a last cycle in the set of address cycles.

8. The memory device of claim 1, comprising:
a first port for the read clock signal having the frequency; and
a second port for address, data and command signals synchronized with the read clock signal,
wherein read data from the memory cells at the address is outputted from the second port in a set of data output cycles in the read clock signal, and the memory cells at the address are electrically decoupled from the sense amplifiers before a first cycle in the set of data output cycles.

9. The memory device of claim 1, comprising:
a first port for the read clock signal having the frequency; and
a second port for address, data and command signals synchronized with the read clock signal,
wherein the address is received in a set of address cycles in the read clock signal, read data from the memory cells at the address is outputted from the second port in a set of data output cycles in the read clock signal, and the timing signal is generated during a latency starting on a last cycle in the set of address cycles and ending on a first cycle in the set of data output cycles, the latency having a duration corresponding to a predetermined number of cycles in the read clock signal.

10. The memory device of claim 1, wherein the selector circuit includes a logic AND gate having inputs receiving the first signal at the first delay and the second signal at the second delay, and an output producing the timing signal.

11. A method for reading a memory device, the memory device comprising an array of memory cells, and a plurality of sense amplifiers coupled with the memory cells, the method comprising:
receiving an address synchronized with a read clock signal;
electrically coupling the memory cells at the address to the sense amplifiers in a read cycle;
electrically decoupling the memory cells at the address from the sense amplifiers in the read cycle in response to a timing signal; and
generating the timing signal including:
generating a first signal having a first delay based on a frequency of the read clock signal;
generating a second signal having a second delay independent of the frequency of the read clock signal; and
generating the timing signal in response to the first signal if the first delay is shorter than the second delay, or in response to the second signal if the second delay is shorter than the first delay.

12. The method of claim 11, the memory device comprising a first port for the read clock signal having the frequency, a second port for address, data and command signals synchronized with the read clock signal, and a plurality of data latches coupled with the plurality of sense amplifiers, the method comprising:
storing read data from the memory cells at the address in the data latches after the memory cells at the address are electrically decoupled from the sense amplifiers until at least the read data is outputted from the second port.

13. The method of claim 11, the memory device comprising a first port for the read clock signal having the frequency, a second port for address, data and command signals synchronized with the read clock signal, wherein the frequency of the read clock signal is in a range from a lower read clock frequency to a higher read clock frequency, the first delay based on the higher read clock frequency is longer than a sensing time and shorter than the second delay, and the second delay is longer than the sensing time and shorter than the first delay based on the lower read clock frequency, the sensing time being between receiving all bits of the address from the first port and developing a signal representing first data sensed to be provided to the second port.

14. The method of claim 11, the memory device comprising a first port for the read clock signal having the frequency, wherein the first port is an external port to the memory device.

15. The method of claim 11, the memory device comprising a first port for the read clock signal having the frequency, and a second port for address, data and command signals synchronized with the read clock signal, wherein the second port is an external port to the memory device, including one or more external pins to the memory device.

16. The method of claim 11,
the first delay beginning on a particular cycle in the read clock signal and having a duration corresponding to a predetermined number of cycles in the read clock signal; and
the second delay beginning on the particular cycle in the read clock signal and having a fixed duration.

17. The method of claim 16, wherein the address is received in a set of address cycles in the read clock signal, and the particular cycle in the read clock signal is subsequent to a last cycle in the set of address cycles.

18. The method of claim 11, the memory device comprising a first port for the read clock signal having the frequency, and a second port for address, data and command signals synchronized with the read clock signal, wherein read data from the memory cells at the address is outputted from the second port in a set of data output cycles in the read clock signal, and the memory cells at the address are electrically decoupled from the sense amplifiers before a first cycle in the set of data output cycles.

19. The method of claim 11, the memory device comprising a first port for the read clock signal having the frequency, and a second port for address, data and command signals synchronized with the read clock signal, wherein the address is received in a set of address cycles in the read clock signal, read data from the memory cells at the address is outputted from the second port in a set of data output cycles in the read clock signal, and the timing signal is generated during a latency starting on a last cycle in the set of address cycles and ending on a first cycle in the set of data output cycles, the latency having a duration corresponding to a predetermined number of cycles in the read clock signal.

20. The method of claim 11, comprising executing a logic AND function receiving the first signal at the first delay and the second signal at the second delay, and producing the timing signal.

21. A circuit, comprising:
a first delay circuit generating a first signal having a first delay based on a frequency of a read clock signal;
a second delay circuit generating a second signal having a second delay independent of the frequency of the read clock signal; and
a selector circuit to generate a timing signal in response to the first signal if the first delay is shorter than the second delay, or in response to the second signal if the second delay is shorter than the first delay.

22. A memory device, comprising:
an array of memory cells;
a plurality of sense amplifiers coupled with the memory cells;
a controller configured to execute a read operation in response to a command and address; and
circuitry to generate a timing signal including a first delay circuit generating a first signal having a first delay based on a frequency of a read clock signal, a second delay circuit generating a second signal having a second delay independent of the frequency of the read clock signal, and a selector circuit to generate the timing signal in response to the first signal if the first delay is shorter than the second delay, or in response to the second signal if the second delay is shorter than the first delay.

23. The memory device of claim 22, comprising:
a first port for the read clock signal having the frequency;
a second port for address, data and command signals synchronized with the read clock signal; and
a plurality of data latches coupled with the plurality of sense amplifiers, the data latches storing read data from the memory cells at the address.

24. The memory device of claim 22, comprising:
a first port for the read clock signal having the frequency; and
a second port for address, data and command signals synchronized with the read clock signal,
wherein the frequency of the read clock signal is in a range from a lower read clock frequency to a higher read clock frequency, the first delay is associated with a sensing time based on the higher read clock frequency, and the second delay is associated with the sensing time based on the lower read clock frequency.

25. The memory device of claim 22, comprising:
a first port for the read clock signal having the frequency; and
a second port for address, data and command signals synchronized with the read clock signal,
wherein read data from the memory cells at the address is outputted from the second port in a set of data output cycles in the read clock signal.

26. A method for reading a memory device, the memory device comprising an array of memory cells, and a plurality of sense amplifiers coupled with the memory cells, the method comprising:
receiving an address synchronized with a read clock signal; and
generating a timing signal including:
generating a first signal having a first delay based on a frequency of the read clock signal;
generating a second signal having a second delay independent of the frequency of the read clock signal; and
generating the timing signal in response to the first signal if the first delay is shorter than the second delay, or in response to the second signal if the second delay is shorter than the first delay.

27. The method of claim 26, the memory device comprising a first port for the read clock signal having the frequency, a second port for address, data and command signals synchronized with the read clock signal, and a plurality of data latches coupled with the plurality of sense amplifiers, the method comprising:
storing read data from the memory cells at the address in the data latches.

28. The method of claim 26, the memory device comprising a first port for the read clock signal having the frequency, a second port for address, data and command signals synchronized with the read clock signal, wherein the frequency of the read clock signal is in a range from a lower read clock frequency to a higher read clock frequency, the first delay is associated with a sensing time based on the higher read clock frequency, and the second delay is associated with the sensing time based on the lower read clock frequency.

29. The method of claim 26, the memory device comprising a first port for the read clock signal having the frequency, and a second port for address, data and command signals synchronized with the read clock signal, wherein read data from the memory cells at the address is outputted from the second port in a set of data output cycles in the read clock signal.

* * * * *